United States Patent
Loh et al.

(10) Patent No.: US 7,493,576 B2
(45) Date of Patent: *Feb. 17, 2009

(54) CDM ESD EVENT PROTECTION IN APPLICATION CIRCUITS

(75) Inventors: William Loh, Fremont, CA (US); Li Lynn Ooi, San Jose, CA (US); Choshu Ito, San Mateo, CA (US)

(73) Assignee: LSI Corporation, Milpitas, CA (US)

( * ) Notice: Subject to any disclaimer, the term of this patent is extended or adjusted under 35 U.S.C. 154(b) by 358 days.

This patent is subject to a terminal disclaimer.

(21) Appl. No.: 11/349,356

(22) Filed: Feb. 7, 2006

(65) Prior Publication Data

US 2006/0245126 A1 Nov. 2, 2006

Related U.S. Application Data

(60) Provisional application No. 60/723,130, filed on Sep. 30, 2005, provisional application No. 60/677,098, filed on May 2, 2005.

(51) Int. Cl.
*G06F 17/50* (2006.01)
*G06F 9/00* (2006.01)

(52) U.S. Cl. .................................. 716/4; 716/1; 716/5

(58) Field of Classification Search ............... 716/2, 716/5, 8, 1, 4
See application file for complete search history.

(56) References Cited

U.S. PATENT DOCUMENTS

2004/0098684 A1 * 5/2004 Amekawa ................. 716/6
2006/0075368 A1 * 4/2006 Bakir et al. ............... 716/10

OTHER PUBLICATIONS

M. Etherton, et al; Verification of CDM Circuit Stimulation Using an ESD Evaluation Circuit.

* cited by examiner

*Primary Examiner*—Stacy A Whitmore
*Assistant Examiner*—Magid Y Dimyan
(74) *Attorney, Agent, or Firm*—Duft Bornsen & Fishman

(57) ABSTRACT

Methods and structure for improved design remediation for previously inexplicable damage to core circuits of an application circuit design caused by CDM ESD events. Features and aspects hereof note that such previously inexplicable damage to core circuits of an application circuit design is caused by inductive coupling between the non-core circuits and the core circuits of an application circuit design. Features and aspects hereof automatically alter an application circuit design to provide remediation by various techniques to reduce the magnitude of such inductive coupling and to thereby reduce susceptibility of the application circuit to damage from CDM ESD events. The modifications may be enforced as rules during initial design of the application circuit or as reconfiguration of a design in response to simulation to discover inappropriate coupling in the design.

18 Claims, 6 Drawing Sheets

CDM ESD EVENT PROTECTION IN APPLICATION CIRCUITS

RELATED PATENTS

This patent application claims priority to U.S. Provisional Patent Application Ser. No. 60/677,098 filed 2 May 2005 and entitled CHARGE DEVICE MODEL (CDM) BASED ELECTROSTATIC DISCHARGE (ESD) PROTECTION and claims priority to U.S. Provisional Patent Application Ser. No. 60/723,130 filed 30 Sep. 2005 and entitled NEW ESD PROTECTION ELEMENT FOR CDM CORE FAILURE PREVENTION, both of which are hereby incorporated by reference.

The patent application is also related to, commonly owned, co-pending, U.S. patent application Ser. No. 11/349,358 filed herewith and entitled IMPROVED CDM ESD EVENT SIMULATION AND REMEDIATION THEREOF IN APPLICATION CIRCUITS, which is hereby incorporated by reference.

BACKGROUND OF THE INVENTION

1. Field of the Invention

The invention relates to charged device model ("CDM") electrostatic discharge ("ESD") events applied to a circuit and protection of the circuit therefrom. More specifically, the improved protection structures and design methods aid in design of the application circuit to avoid circuit structures that are susceptible to damage from CDM ESD events.

2. Discussion of Related Art

A frequent cause of failure in electronic circuit designs stems from ESD events. ESD events can generate substantial current flows and corresponding voltages within an application circuit that may easily damage a circuit design if left devoid of any protective measures. Thus, it is common for circuit designers to include ESD protection components for some circuitry in an application circuit design. Typically, such remedial components are added to circuits of the application design that are exposed to the external environment of the application circuit design. Such externally exposed circuits are susceptible to damage from ESD events. Thus, ESD clamp circuits and other familiar electronic designs are common for a circuit design engineer to utilize for all externally exposed circuit components of an application circuit design. Examples of externally exposed circuits are I/O circuits in which signals are exchanged between the application circuit and neighboring devices. As used herein, "core circuits" or "core components" refer to components of an application circuit design that are not I/O circuits.

The presumption of designers has generally been that if the externally exposed circuits of the application design are protected from damage by ESD events, then the other components of the application design (e.g., core components not generally externally exposed) will also be protected. The presumption assumes that since the damaging ESD current and voltage will be shunted away at the externally exposed circuits, then the core components will be safeguarded.

One particular type of ESD event has been widely recognized as a common type of event—typical of real world ESD events that frequently damage application circuits. The charged device model ("CDM") is now widely accepted as an accurate model of real world ESD events that frequently damage application circuits. A wide variety of testing systems and tools have been developed to aid application circuit designers and fabricators in generating such CDM ESD events for controlled, repeatable, robust testing of an application circuit's immunity to such events. Such test systems actually generate CDM ESD events in a controlled, repeatable manner so that actual application circuits may be tested in accordance with standardized CDM ESD conditions. A JEDEC specification for such CDM ESD testing is well known to those of ordinary skill in the art in readily available at www.jedec.org.

A problem has been noted during CDM ESD testing wherein core circuits of an application circuit design are inexplicably damaged despite adherence to design principles that provide ESD protection for externally exposed circuits (e.g., non-core circuits) in the application circuit design. For example, where voltage and current from an ESD event are properly blocked or shunted by ESD clamps or other ESD protection circuits applied to externally exposed circuitry, core circuits internal to the application circuit design may none the less be inexplicably damaged. Current design tools and simulation techniques have been incapable of addressing this collateral damage to core circuits caused by real ESD events and/or caused by ESD testing systems.

It is evident from the above discussion that a need exists for improved design tools and circuit design methods to remediate an application circuit design so as to avoid such in an application circuit design.

SUMMARY OF THE INVENTION

The present invention solves the above and other problems, thereby advancing the state of the useful arts, by providing improved circuit design methods and resultant circuit structures that remedy susceptibility of an application circuit design from damage to core circuits in response to CDM ESD events.

A feature hereof therefore provides a method for improving an application circuit design for protection from CDM ESD events wherein the application circuit includes a plurality of core circuits and a non-core circuit, the method comprising: simulating operation of the application circuit during a simulated CDM ESD event to identify a core circuit that may be damaged from inductive coupling to the non-core circuit in response to a simulated CDM ESD event; and modifying the application circuit design to reduce inductive coupling between the identified core circuit an the non-core circuit.

Another aspect hereof further provides that the non-core circuit is associated with a non-core trace, wherein the core circuit is associated with a core trace, and provides that the step of modifying further comprises inserting one or more shield traces between the core trace and the non-core trace to reduce inductive couplings between the core circuit and the non-core circuit.

Another aspect hereof further provides that the non-core circuit is associated with a non-core trace, wherein the core circuit is associated with a core trace, and provides that the step of inserting shield traces further comprises inserting the one or more shield traces between the core trace and the non-core trace such that the inserted one or more shield traces are coupled with low impedance return paths to the non-core circuit.

Another aspect hereof further provides that the non-core circuit is associated with a non-core trace, wherein the core circuit is associated with a core trace, and provides that the step of inserting the one or more shield traces further comprises inserting the one or more shield traces between the core trace and the non-core trace such that the inserted one or more shield traces are coupled through power/ground meshes as return paths to the non-core circuit.

Another aspect hereof further provides that the non-core circuit is associated with a non-core trace, provides that the core circuit is associated with a core trace, and provides that the step of modifying further comprises using existing dummy lines incorporated in the application circuit as metal density fillers as shields between the core trace and the non-core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing power/ground signal traces of the application circuit to serve as shield traces between the core trace and the non-core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing the non-core trace to shield it from the core trace by power/ground signal traces of the application circuit positioned between the non-core trace and the core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing power/ground signal traces of the application circuit to serve as shield traces between the core trace and the non-core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing the core trace to reduce the length of the core trace that is substantially parallel to the non-core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing the core trace to increase the distance of the core trace from the non-core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing the non-core trace to reduce the length of the non-core trace that is substantially parallel to the core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing the non-core trace to increase the distance of the non-core trace from the core trace to reduce inductive couplings between the core circuit and the non-core circuit.

Another aspect hereof further provides that the non-core circuit is associated with a non-core trace, provides that the core circuit is associated with a core trace, and provides that the step of modifying further comprises re-routing either the core trace or the non-core trace to reduce inductive couplings between the core circuit and the non-core circuit.

Another feature hereof provides a system for application circuit design to reduce susceptibility of the application circuit to damage from CDM ESD events applied thereto wherein the application circuit comprises one or more core circuits and a non-core circuit, the system comprising: a simulation system for simulating operation of the application circuit during a simulated CDM ESD event to identify a core circuit that may be damaged from inductive coupling to the non-core circuit in response to a simulated CDM ESD event; and a circuit design system communicatively coupled to the simulation system for modifying the application circuit design to reduce inductive coupling between the identified core circuit an the non-core circuit.

Another aspect hereof further provides that the non-core circuit is associated with a non-core trace, provides that the core circuit is associated with a core trace, and provides that the circuit design system is adapted to re-route either the core trace or the non-core trace to reduce inductive couplings between the core circuit and the non-core circuit.

Another aspect hereof further provides that the non-core circuit is associated with a non-core trace, provides that the core circuit is associated with a core trace, and provides that the circuit design system is adapted to insert one or more shield traces between the core trace and the non-core trace to reduce inductive couplings between the core circuit and the non-core circuit.

Another aspect hereof further provides that the non-core circuit is associated with a non-core trace, provides that the core circuit is associated with a core trace, and provides that the circuit design system is adapted to use existing dummy lines incorporated in the application circuit as metal density fillers as shields between the core trace and the non-core trace to reduce inductive couplings between the core circuit and the non-core circuit.

Another aspect hereof further provides that the non-core circuit is associated with a non-core trace, providing that the core circuit is associated with a core trace, and providing that the circuit design system is adapted to re-route power/ground signal traces of the application circuit to serve as shield traces between the core trace and the non-core trace to reduce inductive couplings between the core circuit and the non-core circuit.

DETAILED DESCRIPTION OF THE DRAWINGS

Figure 1:
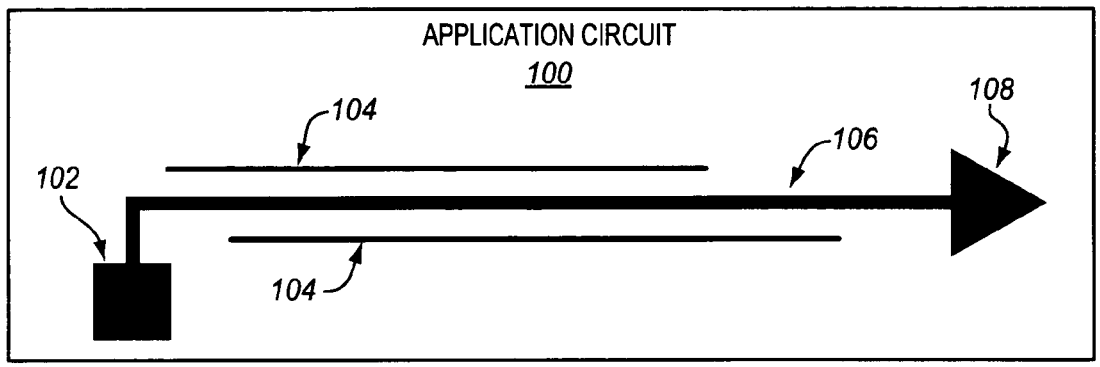
FIG. 1 is a block diagram of an application as presently practiced devoid of CDM ESD remediation.

FIG. 1 is a block diagram of a typical application circuit 100 as presently known in the art. FIG. 1 represents an abstract schematic top view of components associated with an integrated circuit 100. Typical integrated circuits comprise a number of layers descending from the top layer through intermediate layers and a bottom layer. A top-most conductive layer, often referred to as the "R-layer", may include I/O signaling components and corresponding conductive traces—e.g., non-core components and non-core traces. For example, in the exemplary application circuit 100 as presently known in the art, a "bump" or connection 102 represents a connecting point for an I/O signal of the application integrated circuit 100. R-layer trace 106 couples the I/O signal bump 102 conductor to an appropriate I/O buffer 108 (e.g., driver/receiver circuitry). Buffer 108 may typically include an ESD clamp circuit useful for guarding the I/O buffer 108 from damage due to ESD discharge. The clamp circuit may be integrated with the receiver circuit 108 or may be a separate, discrete component (not shown). Thus bump 102, buffer 108, and the coupling R-layer trace 106 may both individually and collectively be referred to as non-core circuits or non-core components. Individually, R-layer trace 106 may be referred to herein as a non-core trace.

Other components (e.g., core components) of application circuit 100 may include corresponding conductive traces 104 coupling driver components (not shown) to corresponding receiver components (not shown). The traces 104 may be referred to herein as core traces. These core traces and the driver and receiver components (not shown) that they couple may be referred to both individually and collectively as core circuits or core components. Such additional components often reside in successive layers of the application circuit 100 below the R-layer. For simplicity of this description, associated driver and receiver components and other functional logic elements within the application circuit 100 are eliminated.

In addition, a typical application circuit 100 would include a plurality of non-core components externally exposed for coupling with other devices as well as a plurality of core devices for performing desired logic functions.

Figure 2:
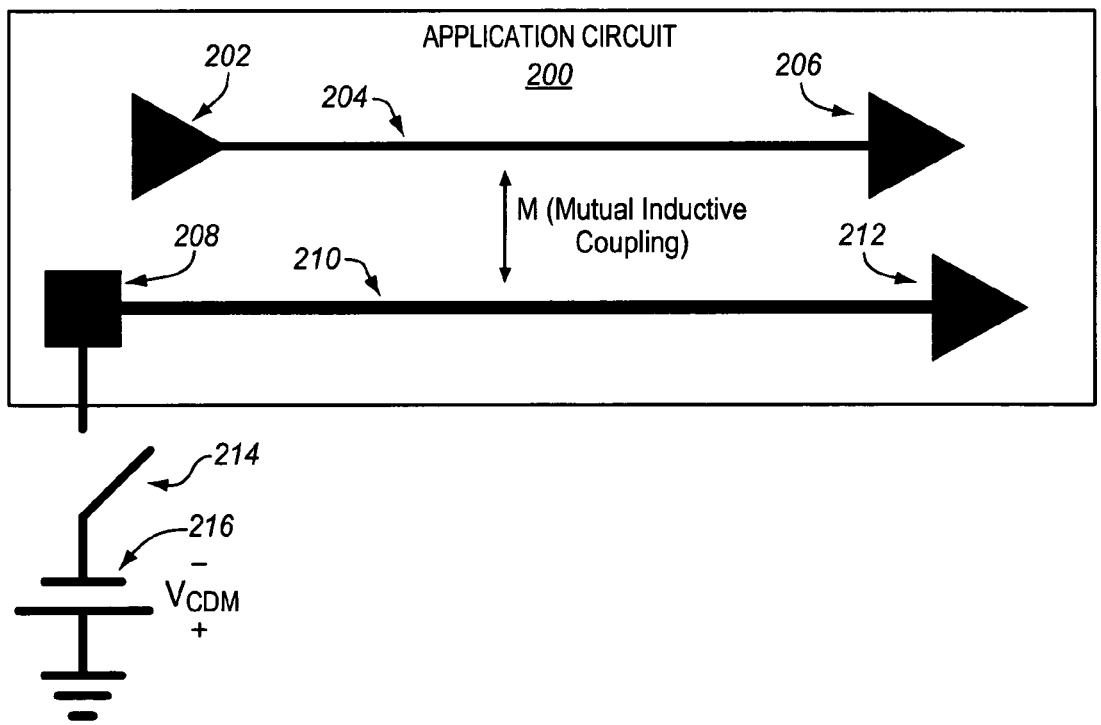
FIG. 2 is a block diagram of an exemplary application circuit depicting the mutual inductive coupling concern realized as an aspect hereof.

As shown in FIG. 1, core traces 104 may be positioned by automated lay-out tools of circuit design tools to be substantially parallel to the R-layer trace 106 (current design tools provide no basis for avoiding such parallel lay-out of traces). A similar application circuit 200 is shown in FIG. 2 in which additional details are provided explaining the realization associated with features and aspects hereof wherein it is noted that a core trace 204 that is laid out substantially parallel to an R-layer trace 210 and sufficiently proximate the R-layer trace 210 (e.g., a non-core trace) may be inductively coupled thereto as indicated by the double headed arrow labeled "M" (e.g., mutual inductive coupling). In particular, R-layer trace 210 couples bump 208 to I/O buffer 212 for purposes of exposing associated I/O signals for coupling of other circuits to application circuit 200. Core circuits associated with the application circuit 200 may include, for example, a driver component 202 coupled via core trace 204 to a receiver component 206 for purposes of driving a particular functional signal from the driver component 202 for application to the receiving component 206.

Current application circuit design tools may lay-out core trace 204 in close proximity to R-layer trace 210. A realization associated with features and aspects hereof notes that if core trace 204 is sufficiently close to an R-layer trace 210, a mutual inductive coupling (indicated as double-ended arrow "M") condition may arise in the circuit structure. Such mutual inductive coupling is similar in effect to so called crosstalk of electronic signals in circuit designs. During normal operation of the application circuit 200, any interference associated with such mutual inductive coupling (e.g., crosstalk) may be negligible and therefore is frequently ignored by current design tools. However, in the presence of an ESD event, in particular a CDM ESD event, a significant induced electrical current may arise in core trace 204 due to the mutual inductive coupling with R-layer (e.g., externally exposed) trace 210.

In general, as is known in the art, a CDM ESD event occurs when the application circuit is charged to a potential relative to ground (negative or positive potential) and then is rapidly discharged through a coupling to ground. As shown in FIG. 2, switch 214 represents a logical coupling of application circuit 200 via bump 208 to ground potential such that any CDM related charge accumulated in or on the application circuit may be rapidly discharged to ground. Such a CDM accumulated charge is indicated in FIG. 2 as $V_{CDM}$. Switch 214 and potential $V_{CDM}$ are not necessarily physically present such as when the discharge occurs in a real environment as distinct from a test environment. Switch 214 and potential $V_{CDM}$ may be actually present in a test environment in which a CDM ESD test system is used to controllably apply a precise CDM ESD event to an application circuit for purposes of testing immunity of the circuit to such events according to standardized, specified conditions.

Even a modest magnitude of such a CDM ESD discharge can generate a substantial current flow in R-layer trace 210. As is generally known in the art, I/O buffer 212 generally is protected from damage by clamp circuitry (sometimes integrated within buffer 212 or sometimes a discrete component—not shown) to protect the logic function of I/O buffer 212 from damage due to such rapid ESD discharge. Though I/O buffer 212 may be protected from damage, the substantial current flow in R-layer trace 210 may induce a current flow in nearby neighboring core traces such as core trace 204. This inductive coupling is indicated in FIG. 2 as double-ended arrow "M". The induced current in core trace 204 may generate a significant potential at a gate of the receiving component 206 coupled to the core trace 204. This potential may easily exceed the breakdown voltage of the gate of the receiving component 206. The magnitude of the potential applied to the gate depends on a number of factors including, for example, the length of the core trace 204, the length of the R-layer trace, and the proximity of the two traces. These and other parameters may be characterized in the application circuit design and/or derived from information therein. Thus, a circuit simulation system may simulate such a CDM ESD event and may identify an R-layer trace and a corresponding core trace that may be inductively coupled so as to possibly generate a harmful induced current and voltage in the core circuits (e.g., at a gate of receiver component 206) in response to a CDM ESD event.

Figure 6:
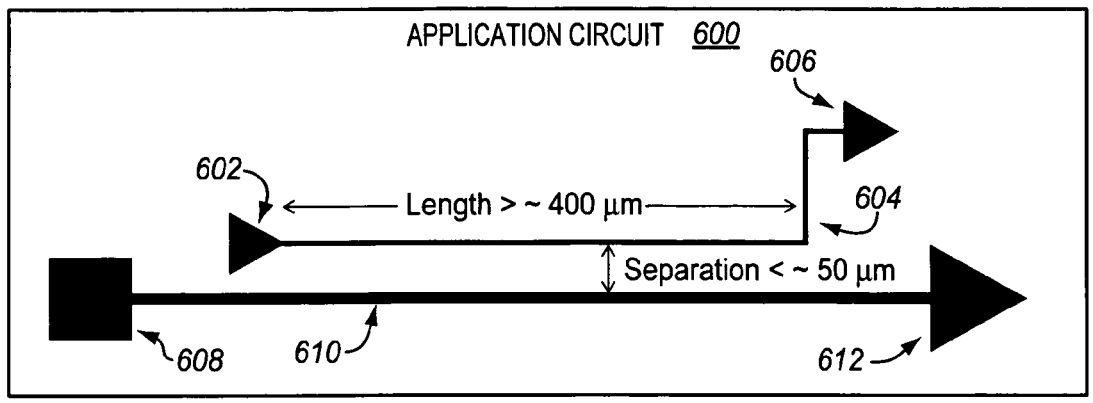
FIG. 6 is a block diagram of an exemplary application circuit depicting typical dimensions determined to give rise to problems from mutual inductive coupling between core and non-core circuits.

FIG. 6 is a block diagram of an exemplary applications circuit 600 depicting typical spacing dimensions of core and non-core traces that may give rise to the mutual inductive coupling problem described with respect to FIG. 2. The core circuit may comprise a driver component 602 and a receiving component 606 coupled by a core trace 604. A nearby to non-core circuit may include bump 608 coupled to I/O buffer 612 through non core trace 610. As indicated, where core trace 604 and non-core trace 610 have substantially parallel segments separated by less than approximately 50 μm for a length of approximately 400 μm, mutual inductive coupling of a sufficient magnitude to damage core circuits may arise in response to a CDM ESD event applied to the non-core circuit (e.g., through bump 608). Those of ordinary skill in the art will readily recognize that these dimensions are intended merely as exemplary but provide some guidance from empirical data as to the relative length and separation of parallel conductive paths that may give rise to such damaging mutual inductive coupling. The precise dimensions for a particular application circuit may be unique to that particular circuit design, to the manufacturing and fabrication processes used, to the conductive materials used for lay-out of traces, and to numerous other factors. A minimum length of approximately 400 μm for a core trace segment running parallel to a non-core trace segment with a separation of less than approximately 50 μm is suggestive of typical dimensions in which the detected problems may arise.

Figure 3:
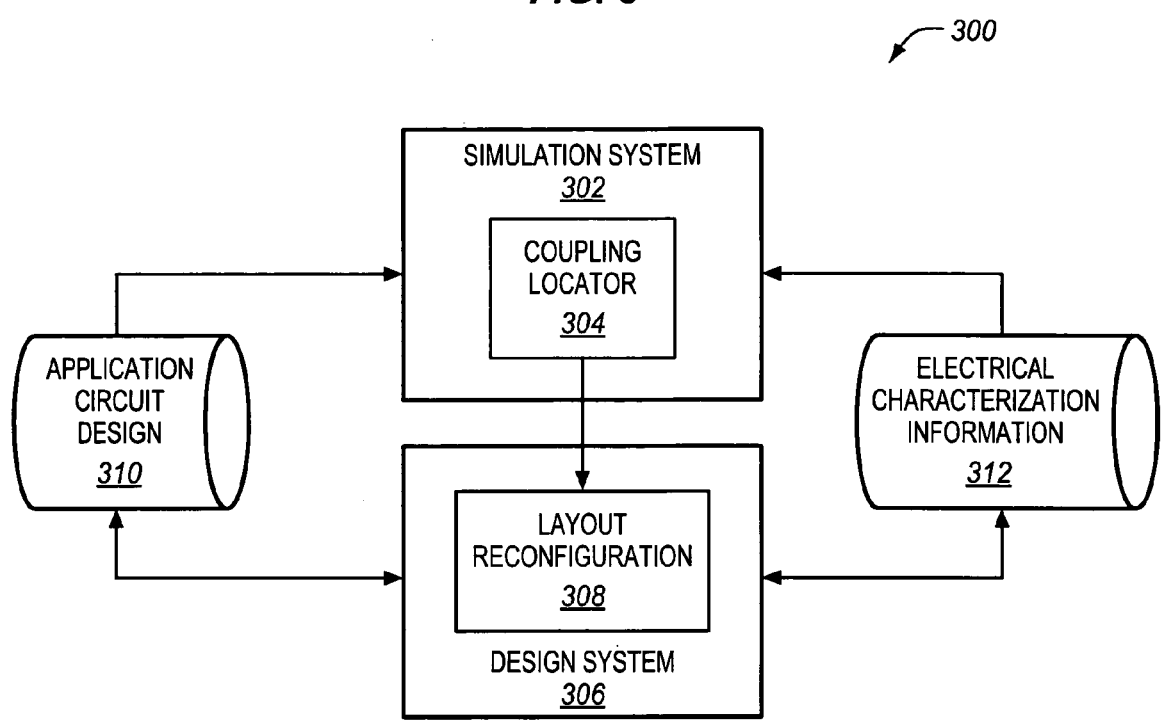
FIG. 3 is a block diagram of a system embodying features and aspects hereof to identify core traces affected by simulated CDM ESD events and to remediate the identified core traces to avoid damage from such events.

FIG. 3 is a block diagram of a system 300 in accordance with features and aspects hereof to identify possible mutually inductively coupled traces and to remediate the coupling to avoid CDM ESD damage therefrom. Application circuit design 310 contains design information regarding the application circuit useful for both circuit design systems and useful for circuit simulation systems. Design information 310 may include, for example, information identifying circuit components (and parameters thereof) that make up the functional elements of the application circuit as well as lay-out information regarding physical placement of circuit components in the integrated circuit die and information locating conductive traces coupling the various circuit components.

Using this design information 310, a simulation system 302 may simulate operation of the application circuit. The simulation system 302 may include an inductive coupling locator component 304 that identifies traces in the application circuit design 310 that may be inductively coupled in a manner that could damage core circuits in response to an applied CDM ESD event. The simulation system may receive information 312 that characterizes electrical properties that relate to the mutually inductively coupled traces and components coupled thereto. This information may, as a matter of design choice, be provided as indicated as a separate source of information or may be integrated with the application circuit design 310. The characterization information 312 may include information that characterizes electrical properties of the application circuit relating to inductive coupling. The electrical characterization information 312 may include resistance, inductance, and capacitance properties of the application circuit. The information 312 may further include electrical properties of the packaging of the application circuit. The packaging may impact the CDM charge level and hence the potential that may be discharged in a CDM ESD event. Electrical properties of the packaging may include parasitic resistance, inductance, and capacitance properties of the packaging of the application circuit. Still further, in simulating a controlled CDM ESD discharge event such as generated in an ESD testing system, electrical properties of the ESD testing system may also be specified in the characterization information 312. An ESD testing system typically couples through the packaging of the application circuit and hence may itself present parasitic electrical properties of resistance, inductance, and capacitance in its coupling to the application circuit package.

Having so located inductively coupled traces in the application circuit design 310 by operation of simulation system 302, design system 306 is invoked to automatically remediate the identified inductive coupling. In particular, lay-out reconfiguration component 308 within design system 306 may alter the lay-out of the application circuit with respect to one or more core circuits and non-core circuits found to be inductively coupled such as to potentially damage the core circuits due to induced voltage and current from CDM ESD events. As discussed further herein below, where a core trace and a non-core trace are found to be close enough to give rise to mutual inductive coupling, lay-out reconfiguration component 308 may alter the lay-out of the associated core trace, may alter the lay-out of the associated non-core trace, may insert or re-route a shield trace between the core trace and non-core trace as well as other lay-out reconfiguration options.

Simulation system 302 and design system 306 may therefore operate repetitively to evaluate potential inductive coupling for each core trace and/or for each R-layer (non-core) trace that may receive potentially harmful current either directly from a CDM ESD event or indirectly induced by the event. In other words, simulation system 302 may simulate CDM ESD events applied to each of potentially multiple R-layer components of the application circuit and evaluate all core traces that may be affected by harmful induced current and associated excessive voltages. Thus, design system 306 modifies the application circuit design 310 to modify the lay-out of the applications circuit to separate court and non-core trace is found to be mutually inductively coupled. The simulation system 302 and design system 306 may therefore the be iteratively and cooperatively operable to identify and resolve all potential inductive coupling problems in application circuit design 310 as may be determined by repetitive simulations utilizing simulation system 302

Those of ordinary skill in the art will readily recognize a wide variety of well known, commercially available design and simulation tools for such application circuit design. Common hardware description languages ("HDL") including for example Verilog HDL ("VHDL"), well known to those of ordinary skill in the art, may be used both for simulation of and for modifications to the application circuit design to remediate any identified inductive coupling between R-layer circuits and core circuits. Further, those of ordinary skill in the art will readily recognize that simulation system 302 and design system 306 may be distinct design and simulation tools or may be integrated within a single design and simulation product. In either case, well known design interchange formats may be used for identifying core traces for which inductive coupling reduction may be required and for modifying an application circuit design accordingly.

Simulation system 302 in design system 306 may be implemented as application programs running in standard personal computers and/or engineering workstations. Such application programs may include well known commercially available products or may include custom designed tools for a particular circuit design enterprise. Still further, characterization information 312 may be obtained directly from the application circuit design as well as vendors that supply circuit designs, from packaging designs, and ESD testing systems. Alternatively, electrical characterization of the application circuit, its associated packaging, and any CDM ESD testing systems may also be derived empirically by performing test operations and measuring the relevant characteristics or computing relevant characteristics given well-known models for such components.

Still further, those of ordinary skill in the art will recognize that processing of lay-out reconfiguration component 308 may also be performed through design rules imposed and enforced by design system 306 during the initial design of application circuit 310. Thus, applications circuit 310 may be initially designed to avoid such mutually inductive coupling between core and non-core traces to thus avoid creation of a design that may damage coarser kits in response to CDM ESD events applied to corresponding non-core circuits.

Figure 7:
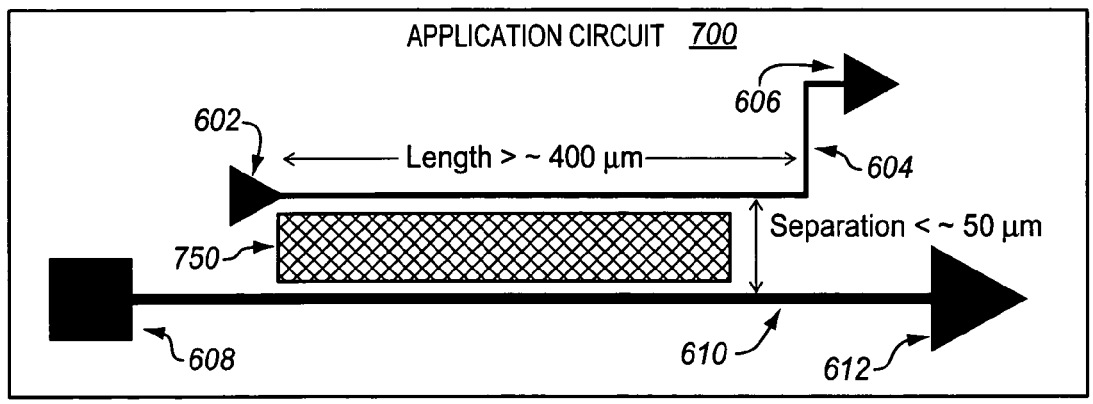
FIGS. 7-9 are block diagrams depicting exemplary application circuits enhanced in accordance with features and aspects hereof to re-route core and/or non-core traces of the application circuit to reduce mutual inductive coupling and thereby remediate damage to core circuits.

FIG. 7 represents an exemplary application circuit similar to that of FIG. 6 in which a buffer zone 750 is established in accordance with features and aspects hereof to assure adequate separation between core and non-core traces to thereby reduce mutual inductive coupling. At any point over which core trace 604 and non-core trace 610 are substantially parallel for greater than a minimum threshold length, one or both traces may be re-routed so as to ensure a separation of more than the minimum threshold as indicated by the buffer zone 750. As noted above, if a portion of the traces are substantially parallel for at least 400 µm, a separation threshold of greater than 50 µm between those parallel portions has been found to be sufficient in typical application circuit designs to avoid undesired inductive coupling. Thus, application circuit 700 may be reconfigured based on simulation testing that identified core trace 604 and non-core trace 610 as likely inductively coupled. The reconfiguration may move core trace 604 and/or non-core trace 610 so as to assure adequate separation by at least the size of the buffer zone 750 for any portions of the traces that run parallel for a sufficient length.

Further, as noted above, the minimum separation may be established as a buffer zone in a rule in the original design efforts for application circuit 700. Thus, the initial design of application circuit 700 may avoid the undesired inductive coupling by assuring a minimum separation distance between the traces during initial design of the application circuit 700 rather than awaiting simulation results and associated re-configuration of the design. As noted above, such a rule in initial design of the application circuit 700 may assure greater than about 50 µm separation between any substantially parallel core and non-core traces over a length at least about 400 µm.

Figure 8:
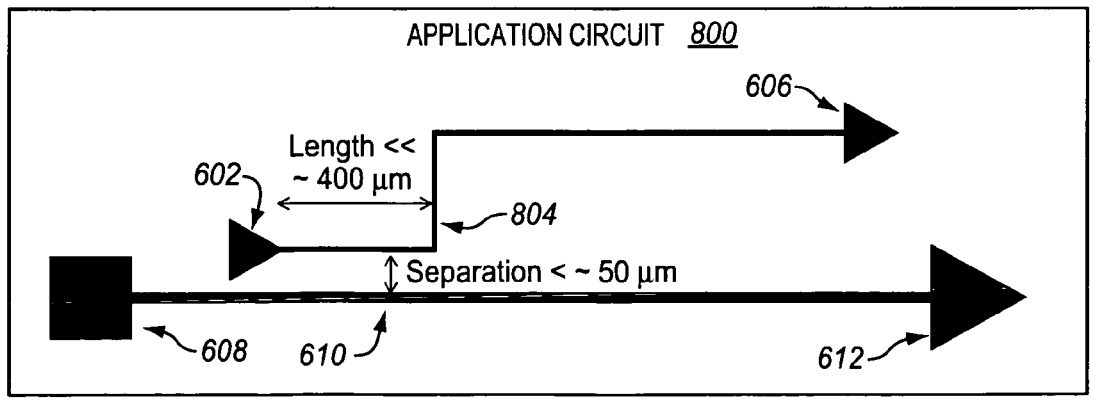

FIG. 8 shows yet another exemplary application circuit 800 similar to that of FIG. 6 but enhanced in accordance with features and aspects to reconfigure the lay-out to avoid inductive coupling. Core trace 804, like core trace 604 of FIG. 6, couples driver component 602 to receiving component 606. Non-core trace 610 couples bump 608 to I/O buffer 612. In accordance with features and aspects hereof, core trace 804 has been reconfigured to reduce the length of a portion that is substantially parallel to non-core trace 610 so that there is no portion that is substantially parallel, greater than about 400 µm in length, and separated from the non-core trace 610 by less than about 50 µm. In essence the core trace 804 has been "jogged" in the reconfiguration as compared to core trace 604 of FIG. 6. Thus the mutual inductive coupling between core trace 804 and non-core trace 610 is reduced to avoid potentially damaging induced current and voltage in core trace 804 responsive to CDM ESD events applied to non-core trace 610 through bump 608.

Figure 9:
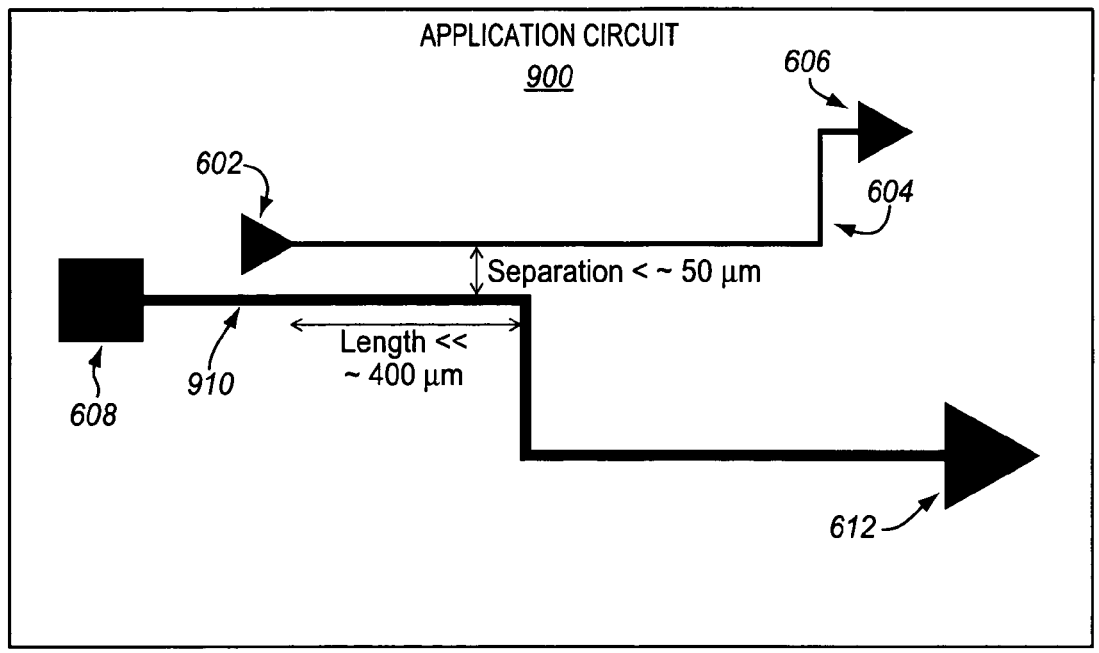

FIG. 9 is similar to FIG. 8 but remedies the potential damage from mutual inductive coupling by reconfiguring non-core trace 910. As above with respect to FIG. 6, a core circuit may include a driver component 602 coupled via core trace 604 to a receiver component 606. Non-core trace 910 couples bump 608 to I/O buffer 612. Non-core trace 910 has been reconfigured as compared to non-core trace 610 of FIG. 6 to reduce the length of the portion thereof that is close to, and parallel with, core trace 604. In essence the non-core trace 910 has been "jogged" in the reconfiguration as compared to non-core trace 610 of FIG. 6. Thus the mutual inductive coupling between core trace 604 and non-core trace 910 is reduced to avoid potentially damaging induced current and voltage in core trace 604 responsive to CDM ESD events applied to non-core trace 910 through bump 608.

In general, FIGS. 8 and 9 represent re-routing of either or both of portions of the core trace and/or non-core trace to reduce the length of any portions of the traces that are close and substantially parallel. Either or both of the core and non-core traces may be so "jogged" to reduce the inductive coupling therebetween. Further, as noted above, this configuration of the core and non-core traces may be enforced by design rules applied during initial design of the application circuits 800 and 900 rather than as a re-configuration step following analysis of simulation results.

Figure 10:
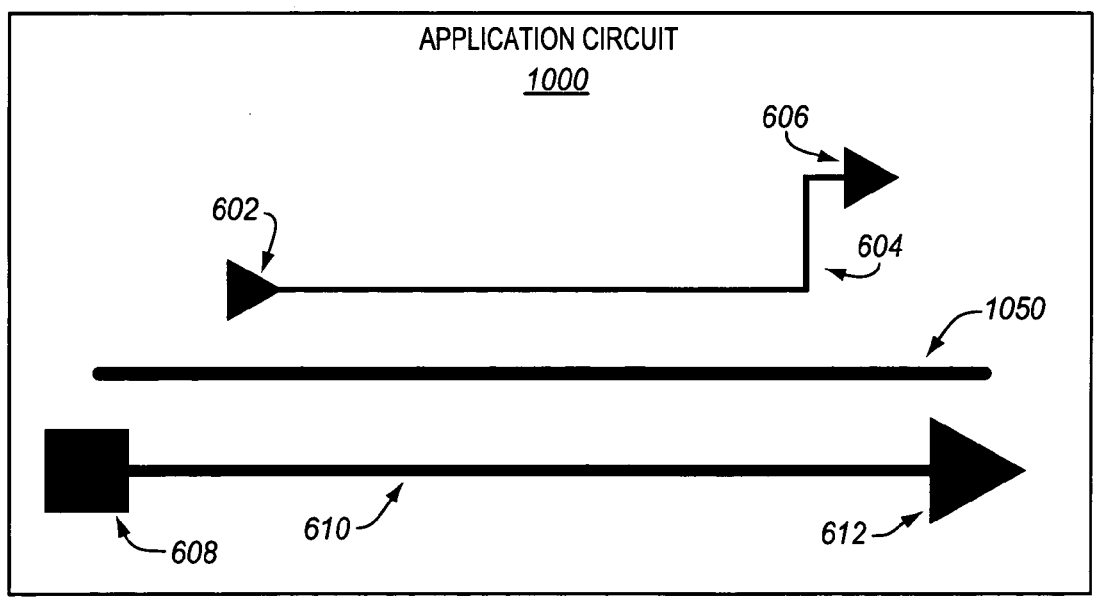
FIG. 10 is a block diagram depicting an exemplary application circuit enhanced in accordance with features and aspects hereof to insert and/or route a shield between core and/or non-core traces of the application circuit to reduce mutual inductive coupling and thereby remediate damage to core circuits.

FIG. 10 represents another application circuit 1000 in accordance with features and aspects hereof wherein a shield trace is added or routed between a core trace 604 and a non-core trace 610 determined to be too close together for too long a distance. Shield trace 1050 is shown routed between core trace 604 and non-core trace 610 to reduce the inductive coupling therebetween. Shield trace 1050 may be any of a variety of traces that serve to shield the core trace 604 from inductive coupling with non-core trace 610. In general, shield trace 1050 may be any conductive trace providing a low impedance return path to the non-core trace such that current will flow in the opposite direction from the current flowing in the non-core trace by virtue of an applied CDM ESD event. Thus the effects of induced current and voltage in the core trace 604 will be negated (e.g., canceled by an opposite field) by the combined effects of the non-core trace 610 and the shield trace 1050. For example, the shield trace 1050 may be coupled to the non-core trace 610 through the ubiquitous power/ground mesh of the application circuit 1050.

Shield trace 1050 may be an additional trace added for this shielding purpose and coupled to other power/ground mesh signal paths or may be an existing power/ground mesh trace re-routed to serve this shielding purpose between core trace 604 and non-core trace 610. Still further, shield trace 1050 may be a "dummy line" (e.g., a conductive path comprising metal density filler material in the application circuit 1000) routed so as to also serve as a shield between the core and non-core traces.

In general, the shield trace 1050 may be comprised of a material having low self-impedance as well as low impedance in the return paths that couple it to the non-core trace. Further, the shield trace 1050 is most effective as a shield when routed for an extensive length (e.g., greater than 400 µm) substantially parallel with non-core trace 610 where it may encounter substantially parallel lengths of associated core traces. Still further, as noted above, the design modification suggested by FIG. 10 may be implemented as a re-configuration of the application circuit in response to simulation processing that identifies core and non-core traces with potentially damaging inductive coupling or may be implemented as a design rule in initial design of the application circuit 1000 so as to avoid designs that are devoid of shielding for the non-core traces. As a design rule enforced by design tools and systems, all non-core traces may be routed only above and/or between power/ground mesh traces so as to always shield nearby core traces. Thus, any core traces that happen to also be routed near the non-core traces will experience reduced inductive coupling to the non-core trace by virtue of the nearby power/ground mesh traces serving to shield that core trace from the non-core trace.

Figure 4:
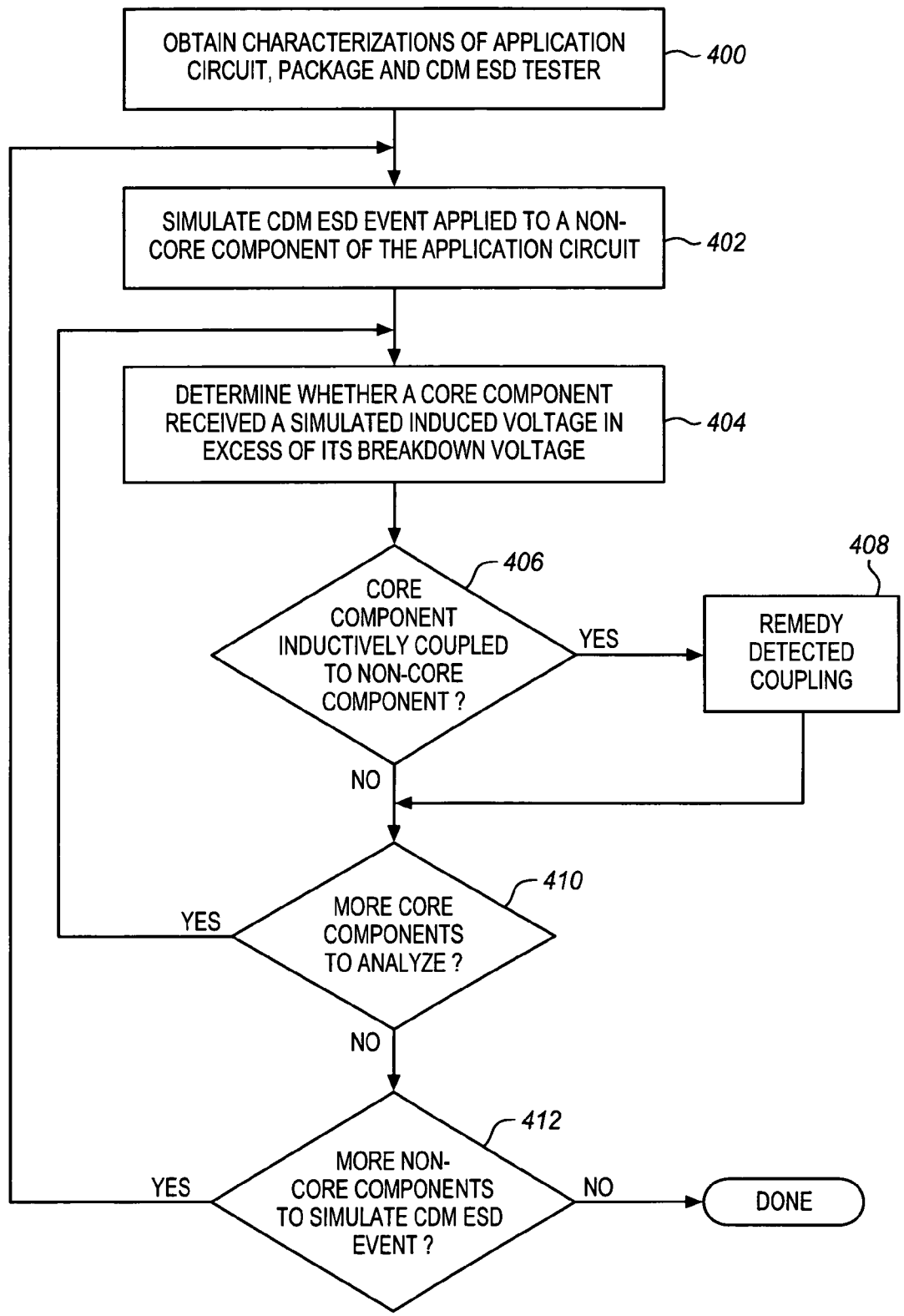
FIGS. 4 and 5 are flowcharts describing methods associated with features and aspects hereof to identify core components potentially affected by CDM ESD events and to remediate the identified traces by reconfiguring an application circuit design to avoid or reduce the damaging induced current.

FIG. 4 is a flowchart describing a method in accordance with features and aspects hereof to identify core traces that may be inductively coupled to associated R-layer traces and to remedy the potential harm to corresponding core circuits that may be caused by induced current and voltage resulting from CDM ESD events. The method of FIG. 4 may be performed within one or more systems that provide both circuit simulation and design features for an application circuit. As noted above with respect to FIG. 3, such simulation and design systems are well known to those of ordinary skill in the art as standard commercial products and may be integrated as a single application program or segregated as multiple application programs running on one or more compute nodes such as personal computers or engineering workstations.

Element 400 is first operable to obtain electrical characterization information regarding the application circuit per se, regarding packaging of the circuit, and any CDM ESD testing system used for testing a component for immunity to such events. Electrical characterization information regarding the application circuit per se is generally incorporated within the design information through standardized models of each component used within the application circuit design. Electrical characterization information regarding packaging of the application circuit may either be computed from standardized models generally known to those of ordinary skill in the art or may be acquired by empirically gathering test data to characterize parasitic electrical parameters of the packaging. In like manner parasitic electrical parameters associated with the CDM ESD testing system used for generating CDM ESD events may also be provided by standard models and computations well known to those skilled in the art or may be gathered from empirical data monitoring of test events generated by such a testing system.

Element 402 is next operable to simulate the CDM ESD event applied to a non-core component of the application circuit. As noted above, non-core components may include any I/O circuitry associated with the application circuit (e.g., that which may be exposed externally to the application circuit). Simulation performed by element 402 reveals core traces inductively coupled to the traces associated with the non-core component to which the simulated CDM ESD event is applied. Elements 404 through 410 are then iteratively operable to identify any core components that may be damaged by induced current and voltage arising from the CDM ESD simulated event applied to an identified non-core component of the application circuit. Element 406 then determines whether any core component within the application circuit indicates that it may receive an inappropriate breakdown voltage caused by the induced current and voltage from the non-core component CDM ESD event. If some core component is identified as having received such a potentially damaging breakdown voltage, element 408 is then operable to remedy the detected inductive coupling. Element 410 determines whether any additional core components need be analyzed by operation of the elements 404 through 408 to identify potential other core components that may be inductively coupled to the non-core component receiving the simulated CDM ESD event. If more core components remain to be analyzed, processing continues looping back to element 404 until all core components identified as likely receiving damaging breakdown voltage have been identified and remedied by operation of element 408. Element 412 is then operable to determine whether more non-core components may be tested by application of a similar simulated CDM ESD event. If so, processing continues looping back to element 402 to repeat simulated test event on the next non-core component. When the process completes, all core components likely to be affected through inductive coupling to a non-core component receiving a CDM ESD event will be identified and appropriately remedied in the application circuit design.

Figure 5:
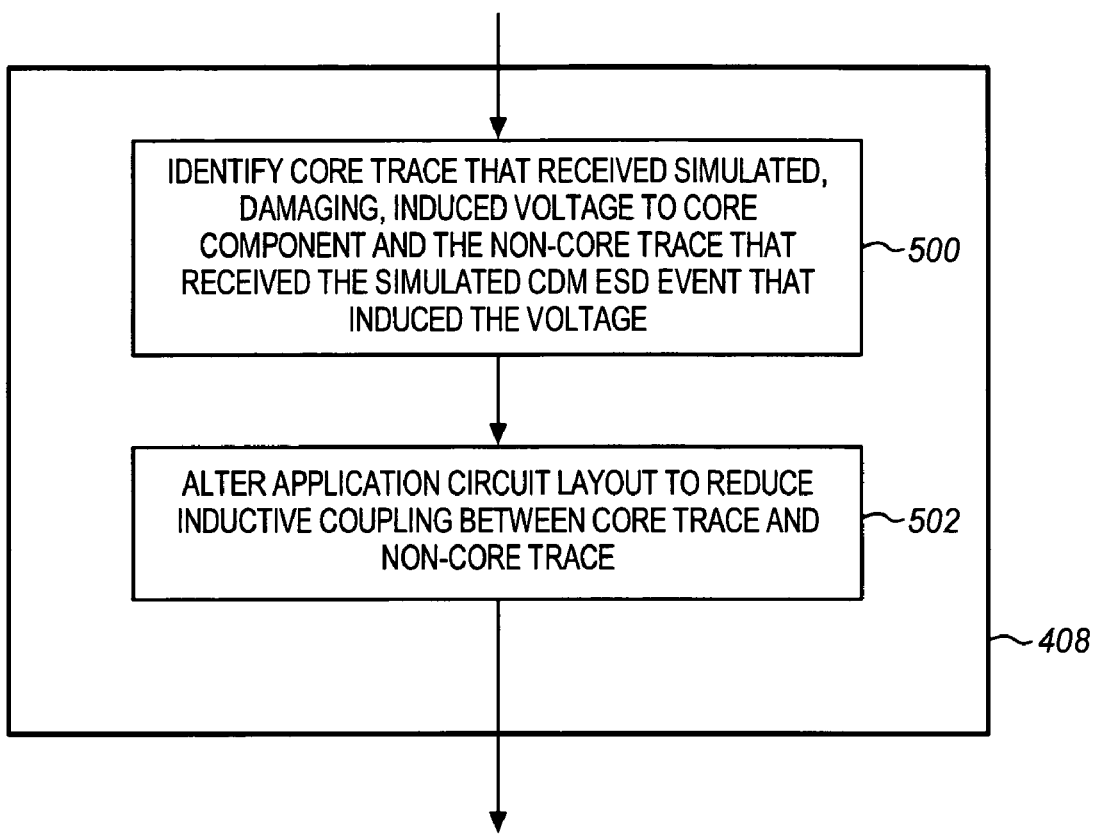

As discussed herein above, numerous potential remedies for such identified inductive coupling may be performed by operation of element 408. In particular, FIG. 5 shows an exemplary embodiment in accordance with features and aspects hereof in which element 408 is operable to remediate an identified core component in the application circuit design to help prevent damage from induced voltage in excess of the component's breakdown voltage. Element 500 is first operable to identify a core trace that received the simulated damaging induced current and voltage from an inductively coupled non-core trace that received a simulated CDM ESD event. As noted above, a core trace coupled to a core component identified as susceptible to damage may have one or more portions of the trace a sufficiently proximal an R-layer (non-core) trace to receive the potentially damaging induced current and voltage. Element 500 therefore represents processing to identify each such portion of the core trace. In some cases, the entirety of a core trace may be identified as a single portion while in other cases routing of the core trace made direct some portions near the R-layer trace while other portions may be sufficiently displaced from the R-layer trace to not receive significant induced current and voltage.

For each identified portion of the core trace inductively coupled to the non-core component, element 502 is operable to alter the lay-out of the core trace and/or of the non-core trace to reduce the undesired inductive coupling therebetween. As noted in the various exemplary solutions represented above in FIGS. 7-10, the core trace and/or the non-core trace may be re-routed to reduce the undesired mutual inductive coupling or one or more shield traces may be added or re-routed between the identified core and non-core circuits to thereby reduce the mutual inductive coupling. Still further, as noted above, the various possible solutions that effectuate re-routing of signal traces or that re-route or add shield traces to reduce the mutual inductive coupling may be performed as a reconfiguration of the application circuit in response to simulation of the application circuit or may be enforced as design rules in the initial design of the application circuit.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A method for improving an application circuit design for protection from CDM ESD events wherein the application circuit includes a plurality of core circuits and a non-core circuit, the method comprising:

simulating operation of the application circuit during a simulated CDM ESD event to identify a core circuit that may be damaged from inductive coupling to the non-core circuit in response to a simulated CDM ESD event wherein the non-core circuit is associated with a non-core trace, wherein the core circuit is associated with a core trace; and modifying the application circuit design to reduce inductive coupling between the identified core circuit and the non-core circuit, wherein the step of modifying further comprises reducing the mutual inductive coupling between the core trace and the non-core trace.

2. The method of claim 1
wherein the step of modifying further comprises:
inserting one or more shield traces between the core trace and the non-core trace to reduce inductive couplings between the core circuit and the non-core circuit.

3. The method of claim 2
wherein the step of inserting shield traces further comprises:
inserting the one or more shield traces between the core trace and the non-core trace such that the inserted one or more shield traces are coupled with low impedance return paths to the non-core circuit.

4. The method of claim 3
wherein the step of inserting the one or more shield traces further comprises:
inserting the one or more shield traces between the core trace and the non-core trace such that the inserted one or more shield traces are coupled through power/ground meshes as return paths to the non-core circuit.

5. The method of claim 1
wherein the step of modifying further comprises:
using existing dummy lines incorporated in the application circuit as metal density fillers as shields between the core trace and the non-core trace to reduce inductive couplings between the core circuit and the non-core circuit.

6. The method of claim 1
wherein the step of modifying further comprises:
re-routing power/ground signal traces of the application circuit to serve as shield traces between the core trace and the non-core trace to reduce inductive couplings between the core circuit and the non-core circuit.

7. The method of claim 1
wherein the step of modifying further comprises:
re-routing the non-core trace to shield it from the core trace by power/ground signal traces of the application circuit positioned between the non-core trace and the core trace to reduce inductive couplings between the core circuit and the non-core circuit.

8. The method of claim 1
wherein the step of modifying further comprises:
re-routing power/ground signal traces of the application circuit to serve as shield traces between the core trace and the non-core trace to reduce inductive couplings between the core circuit and the non-core circuit.

9. The method of claim 1
wherein the step of modifying further comprises:
re-routing the core trace to reduce the length of the core trace that is substantially parallel to the non-core trace to reduce inductive couplings between the core circuit and the non-core circuit.

10. The method of claim 1
wherein the step of modifying further comprises:
re-routing the core trace to increase the distance of the core trace from the non-core trace to reduce inductive couplings between the core circuit and the non-core circuit.

11. The method of claim 1
wherein the step of modifying further comprises:
re-routing the non-core trace to reduce the length of the non-core trace that is substantially parallel to the core trace to reduce inductive couplings between the core circuit and the non-core circuit.

12. The method of claim 1
wherein the step of modifying further comprises:
re-routing the non-core trace to increase the distance of the non-core trace from the core trace to reduce inductive couplings between the core circuit and the non-core circuit.

13. The method of claim 1
wherein the step of modifying further comprises:
re-routing either the core trace or the non-core trace to reduce inductive couplings between the core circuit and the non-core circuit.

14. A system for application circuit design to reduce susceptibility of the application circuit to damage from CDM ESD events applied thereto wherein the application circuit comprises one or more core circuits and a non-core circuit, the system comprising:

a simulation system for simulating operation of the application circuit during a simulated CDM ESD event to identify a core circuit that may be damaged from inductive coupling to the non-core circuit in response to a simulated CDM ESD event wherein the non-core circuit is associated with a non-core trace, wherein the core circuit is associated with a core trace; and a circuit design system communicatively coupled to the simulation system for modifying the application circuit design to reduce inductive coupling between the identified core circuit and the non-core circuit, wherein the circuit design system is adapted to modify the application circuit design by reducing the mutual inductive coupling between the core trace and the non-core trace.

15. The system of claim 14
wherein the circuit design system is adapted to re-route either the core trace or the non-core trace to reduce inductive couplings between the core circuit and the non-core circuit.

16. The system of claim 14
wherein the circuit design system is adapted to insert one or more shield traces between the core trace and the non-core trace to reduce inductive couplings between the core circuit and the non-core circuit.

17. The system of claim 14
wherein the circuit design system is adapted to use existing dummy lines incorporated in the application circuit as metal density fillers as shields between the core trace and the non-core trace to reduce inductive couplings between the core circuit and the non-core circuit.

18. The system of claim 14
wherein the circuit design system is adapted to re-route power/ground signal traces of the application circuit to serve as shield traces between the core trace and the non-core trace to reduce inductive couplings between the core circuit and the non-core circuit.

* * * * *